(12) United States Patent
Ramasubramaniyan et al.

(10) Patent No.: US 11,739,419 B2
(45) Date of Patent: Aug. 29, 2023

(54) HIGHLY ADHESIVE CVD GROWN BORON DOPED DIAMOND GRADED LAYER ON WC-CO

(71) Applicant: INDIAN INSTITUTE OF TECHNOLOGY MADRAS (IIT MADRAS), Chennai (IN)

(72) Inventors: Kannan Ramasubramaniyan, Chennai (IN); Narayanan Arunachalam, Chennai (IN); Ramachandra Rao, Chennai (IN)

(73) Assignee: INDIAN INSTITUTE OF TECHNOLOGY MADRAS (IIT MADRAS), Chennai (IN)

( * ) Notice: Subject to any disclaimer, the term of this patent is extended or adjusted under 35 U.S.C. 154(b) by 620 days.

(21) Appl. No.: 16/608,790

(22) PCT Filed: Apr. 26, 2018

(86) PCT No.: PCT/IN2018/050258
§ 371 (c)(1),
(2) Date: Oct. 25, 2019

(87) PCT Pub. No.: WO2018/198136
PCT Pub. Date: Nov. 1, 2018

(65) Prior Publication Data
US 2020/0181764 A1    Jun. 11, 2020

(30) Foreign Application Priority Data

Apr. 27, 2017   (IN) .............................. 201741015018

(51) Int. Cl.
*C23C 16/02*   (2006.01)
*C23C 16/27*   (2006.01)
(Continued)

(52) U.S. Cl.
CPC ............ *C23C 16/029* (2013.01); *B23B 27/14* (2013.01); *B23B 27/148* (2013.01);
(Continued)

(58) Field of Classification Search
CPC ...... B23B 27/14; B23B 27/148; C23C 16/278
(Continued)

(56) References Cited

U.S. PATENT DOCUMENTS 5,236,740 A * 8/1993 Peters ...................... C23F 1/02
216/100
2006/0112648 A1* 6/2006 Hanyu .................. C23C 30/00
51/295

(Continued)

FOREIGN PATENT DOCUMENTS

JP    H04168276 A    6/1992
JP    05-123905    *    5/1993
(Continued)

OTHER PUBLICATIONS

Srinvasan et al "On the development of dual-layered diamond-coated tool for the effective machining of titanium Ti-6AI-4V alloy" j. Phys. D : Appl Phy 50 p. 1-10. (Year: 2017).*

(Continued)

*Primary Examiner* — Elizabeth Collister
(74) *Attorney, Agent, or Firm* — Convergence Intellectual Property Law P.C.; Jonathan Garfinkel

(57) ABSTRACT

Improved thin film coatings, cutting tool materials and processes for cutting tool applications are disclosed. A boron-doped graded diamond thin film for forming a highly adhesive surface coating on a cemented carbide (WC—Co) cutting tool material is provided. The thin film is fabricated in a HFCVD reactor. It is made of a bottom layer of BMCD in contact with a surface layer of the cemented carbide, a top layer made of NCD and a transition layer with a decreasing (Continued)

concentration gradient of boron obtained by changing the reaction conditions through ramp up option in hot filament CVD reactor. The top layer has a low friction coefficient. The bottom layer in the coating substrate interface has better interfacial adhesion through cobalt and boron reactivity and decreased cobalt diffusivity in the diamond. The transition layer has minimized lattice mismatch and sharp stress concentration between the top and bottom layers.

8 Claims, 11 Drawing Sheets

(51) Int. Cl.
    *B23B 27/14*     (2006.01)
    *C23C 16/455*     (2006.01)

(52) U.S. Cl.
    CPC ........ *C23C 16/0227* (2013.01); *C23C 16/271* (2013.01); *C23C 16/278* (2013.01); *C23C 16/45557* (2013.01)

(58) Field of Classification Search
    USPC .......................................................... 428/408
    See application file for complete search history.

(56) References Cited

U.S. PATENT DOCUMENTS

2014/0037932 A1* 2/2014 Twitchen ................ C30B 31/22
428/220

2014/0341664 A1* 11/2014 Meguro .................... B23C 5/16
407/119
2017/0043406 A1* 2/2017 Waki ....................... B23B 51/02

FOREIGN PATENT DOCUMENTS

| JP | 06-285704 | * 10/1994 |
| JP | 2006-152423 | * 6/2006 |

OTHER PUBLICATIONS

Lei et al "Effect of Boron-Doped Diamond Interlayer on Cutting Performance of Diamond Coated Micro Drills for Graphite Machining" Materials 6, pp. 3128-3138. (Year: 2013).*
Dumpala et al.,Growth and characterization of integrated nano- and microcrystalline dual layer composite diamond coatings on WC-Co substrates, Int. Journal of Refractory Metals and Hard Materials 37 (2013) , pp. 127-133 (Year: 2013).*
Yao et al., Effect of Boron Concentration on Adhesion and Cutting Performance of Diamond-Coated Cemented Carbide Tools, Key Engineering Materials, vols. 375-376, p. 138-142 (Year: 2008).*
International Search Report and Written Opinion for application No. PCT/IN2018/050258 dated Aug. 17, 2018, 8 pages.

* cited by examiner

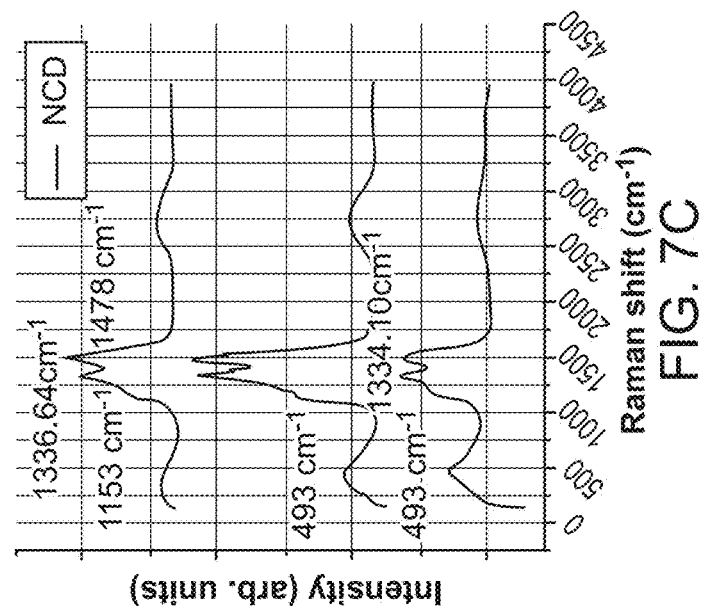
FIG. 7C
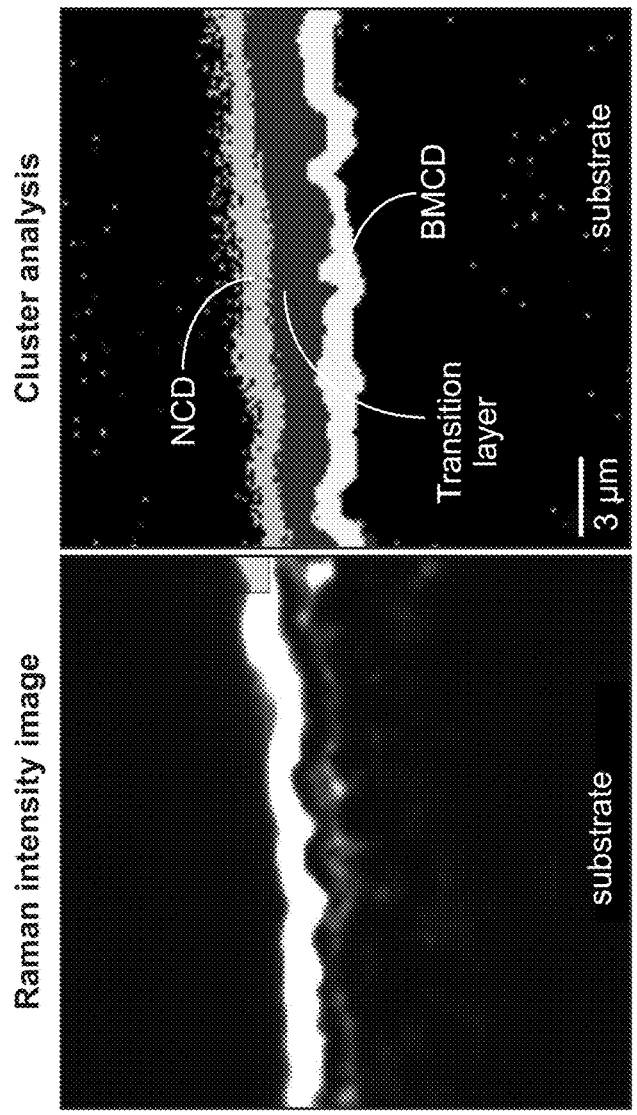
FIG. 7B
FIG. 7A

HIGHLY ADHESIVE CVD GROWN BORON DOPED DIAMOND GRADED LAYER ON WC-CO

CROSS-REFERENCES TO RELATED APPLICATIONS

This application is a 35 U.S.C. 071 national stage filing of PCT Patent Application Number PCT/IN2018/050258, filed Apr. 26, 2018, which claims the benefit and priority to the complete specification of Indian patent application no. 201741015018 filed on Apr. 27, 2017.

FIELD OF THE INVENTION

The invention generally relates to cutting tool applications, and more specifically, to cutting tool materials, films and processes for hard metal tools used in machining of materials.

DESCRIPTION OF THE RELATED ART

Hard metal, such as WC—Co, is a dominant cutting tool material used in metal cutting industries over a past several decades due to its combined hardness and good toughness. This improved toughness is attributed to the presence of cobalt binder in WC matrix which provides fracture resistance property to the hard metal. However, these cutting tools fail to perform, when it comes to machining of carbon fiber reinforced plastic (CFRP), ceramic and metal matrix composites. This may be due to the abrasive nature of fibers and the presence of hard reinforcement phase in the primary matrix material. The preferred cutting tool material for machining of these materials is synthetic polycrystalline diamond (PCD) tool. Due to its high fabricating cost, there is a need for alternate cutting tool material for efficient machining of these materials. In this aspect CVD diamond coating on WC—Co is found to be a most promising alternative cutting tool material for replacing PCD's in machining applications.

In this aspect, microcrystalline diamond (MCD) coating has gained importance due to its extreme hardness. On the other hand nanocrystalline diamond (NCD) based coatings benefit from lower friction coefficient. To obtain hard coatings (~50 GPa) with low friction coefficient (0.004), multi-layer MCD/NCD coatings can be used. However, under harsh machining environment, these diamond coatings get completely delaminated from the substrate due to high machining stresses.

The coating delaminations occur due to the poor adhesion between coating and substrate. This poor adhesion can be attributed to factors such as difference in thermal expansion coefficient between substrate and coating and interfacial graphitisation at higher deposition temperature.

The graphitisation occurs during diamond nucleation stage where the cobalt from the substrate diffuses in to diamond and converts $sp^3$ diamond into $sp^2$ graphite. The Presence of graphite (q phase) at the interface is detrimental to the diamond coating.

SUMMARY OF THE INVENTION

The invention generally relates to cutting tool applications, and more specifically, to cutting tool materials, films and processes used in machining of materials.

In one embodiment, a boron-doped graded diamond thin film for forming a highly adhesive surface coating on a cemented carbide (WC—Co) cutting tool is provided herein. In some embodiments, a bottom coating layer comprising a boron-doped microcrystalline diamond (BMCD) is formed on a surface layer of the cemented carbide material. In one embodiment, the concentration of boron in the bottom layer is between 0.2-0.25%. In yet another embodiment, the concentration of cobalt in the surface layer is between 0.1-1%. In certain embodiments, a top coating layer comprising nanocrystalline diamond (NCD) substantially free of boron is formed. In some embodiments, a transition coating layer is formed between the top and bottom layers. In one embodiment, the transition coating layer comprises a decreasing concentration gradient of boron from the bottom layer to top layer. In some embodiments, the concentration of boron in the surface of transition layer in contact with the bottom layer is 0.2-0.25%. In yet other embodiments, the concentration of boron in the surface of transition layer in contact with top layer is substantially free of boron.

In certain embodiments, the total thickness of the thin film is 4-10 microns. In other embodiments, the bottom layer has a thickness of 1-6 microns. In yet other embodiments, the transition layer has a thickness of 0.1-5 microns. In some embodiments, the top layer has a thickness of 0.01-3 microns.

In another embodiment, an enhanced cutting tool, comprising a cemented carbide (WC—Co) matrix with a cobalt-depleted surface layer is provided. In one embodiment, the matrix comprises 1-6% cobalt and the surface layer comprises 0.1-1% cobalt. In one embodiment, a boron-doped graded diamond thin film is coated on the cemented carbide matrix. In one embodiment, a bottom coating layer is formed on the surface layer of the cemented carbide material, comprising a boron-doped microcrystalline diamond (BMCD). In another embodiment, the concentration of boron in the bottom layer is between 0.2-0.25%. In one embodiment, a top coating layer comprising a nanocrystalline diamond (NCD) substantially free of boron is formed. In another embodiment, a transition coating layer is formed between the top and bottom layers. In some embodiments, the transition layer comprises a decreasing concentration gradient of boron from 0.2-0.25% in the portion in contact with the bottom layer to the portion in contact with the top layer substantially free of boron. In one embodiment, the grain size of the top layer is between 100 nm to 1000 nm. In one embodiment, the grain size of the bottom layer is between 500 nm to 1500 nm. In one embodiment, the grain size of the transition layer is between 100 nm to 1500 nm. In one embodiment, the surface roughness value of the material is 100 nm or lower.

In yet another embodiment, a process for obtaining an enhanced cutting tool is provided. In one embodiment, the process includes forming a cobalt depleted surface layer on a cemented carbide (WC—Co) matrix by sequential chemical etching of the carbide and the cobalt. In one embodiment, the cobalt concentration is between 1% to 6% in the matrix and 0.1% to 1% in the surface layer. In one embodiment, the process includes coating the cobalt-depleted surface layer with a boron-doped graded diamond thin film in a hot filament CVD reactor. In another embodiment, the process includes depositing a bottom coating layer comprising a boron-doped microcrystalline diamond (BMCD) over the cobalt depleted surface layer. In one embodiment, the concentration of boron in the bottom layer is between 0.2-0.25%. In certain embodiments, the process includes depositing a top coating layer comprising nanocrystalline diamond (NCD) substantially free of boron. In other embodiments, the process includes depositing a transition coating layer between the top and bottom layers by decreasing the concentration of boron gradually from 0.2-0.25% in the bottom layer to substantially free of boron near the top layer. In certain embodiments, the process includes coating the cobalt-depleted surface layer with a boron-doped graded diamond film in a hot filament CVD reactor by activating a precursor gas with refractory tungsten filaments heated to a temperature of 2000° C. or greater. In one embodiment, the precursor gases comprise hydrogen, methane, trimethyl borate or a combination thereof. In another embodiment, the precursor gas concentration flowing through the reactor is between 2% to 4%. In one embodiment, the transition coating layer is obtained by decreasing the concentration of boron by decreasing the flow rate of trimethyl borate in the reactor. In yet another embodiment, a distance of at least 15 mm is maintained between tungsten filament and the cemented carbide surface. In another embodiment, the process includes heating the cemented carbide surface to a temperature of 850° C. or higher prior to coating. In one embodiment, a reactor pressure of 1800-5200 Pa is maintained. In one embodiment, a reactor pressure of 4800 Pa is maintained to obtain the bottom layer. In one embodiment, a reactor pressure of 2000 Pa is maintained to obtain the top layer. In yet another embodiment, a decreasing gradient of 4800-2000 Pa is applied in the reactor to obtain the transition layer. In one embodiment, the coating time is between 2 to 6 h.

This and other aspects of the invention are set forth herein.

BRIEF DESCRIPTION OF THE DRAWINGS

The invention has other advantages and features which will be more readily apparent from the following detailed description of the invention and the appended claims, when taken in conjunction with the accompanying drawings, in which:

FIG. 7 shows the Raman intensity image, cluster analysis and cross sectional Raman spectrum for the boron-doped graded thin film coating.

DETAILED DESCRIPTION

Figure 1:
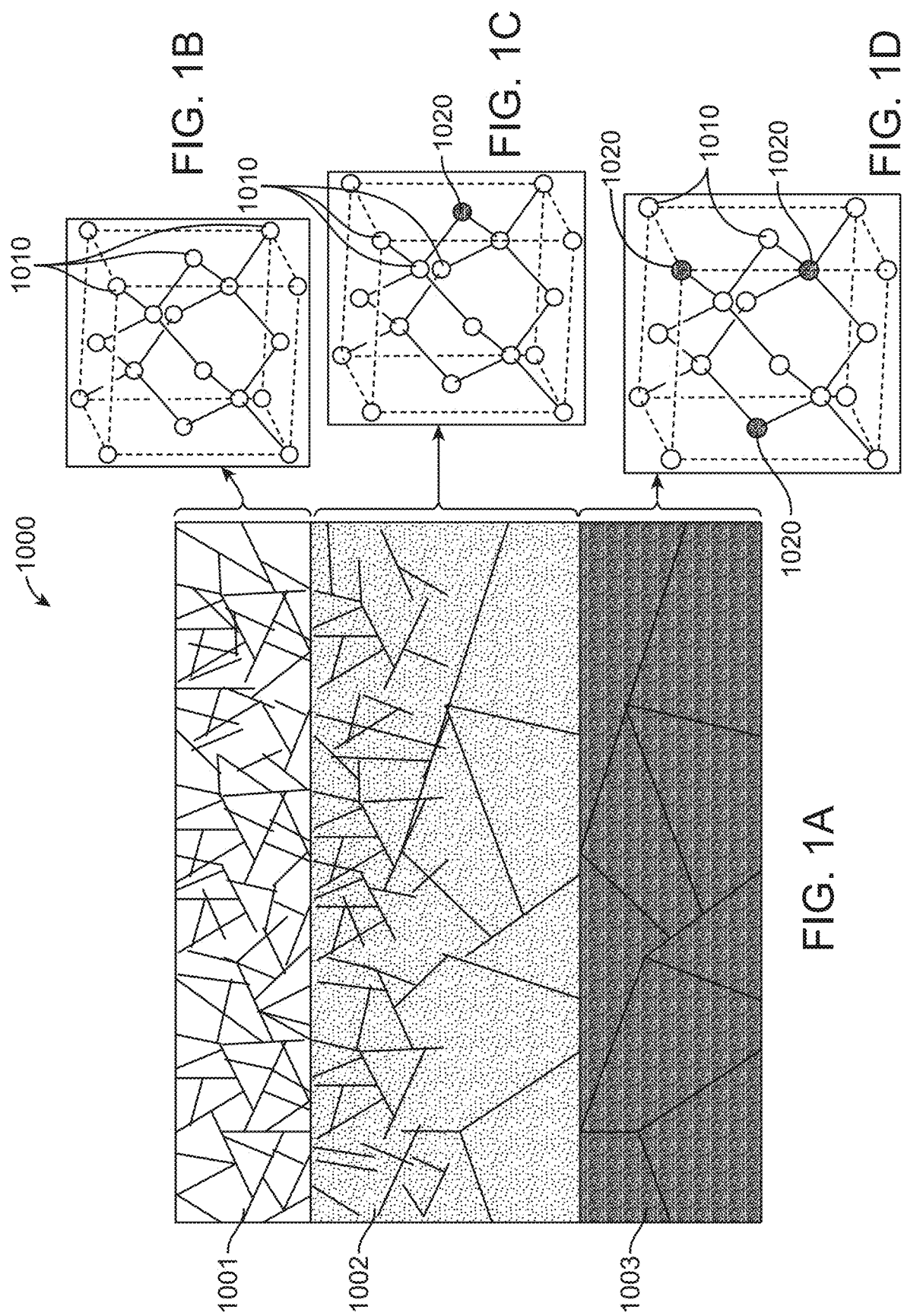
FIG. 1 shows the structure of a boron-doped graded diamond thin film.

While the invention has been disclosed with reference to certain embodiments, it will be understood by those skilled in the art that various changes may be made and equivalents may be substituted without departing from the scope of the invention. In addition, many modifications may be made to adapt to a particular situation or material to the teachings of the invention without departing from its scope.

Throughout the specification and claims, the following terms take the meanings explicitly associated herein unless the context clearly dictates otherwise. The meaning of "a", "an", and "the" include plural references. The meaning of "in" includes "in" and "on." Referring to the drawings, like numbers indicate like parts throughout the views. Additionally, a reference to the singular includes a reference to the plural unless otherwise stated or inconsistent with the disclosure herein.

The word "exemplary" is used herein to mean "serving as an example, instance, or illustration." Any implementation described herein as "exemplary" is not necessarily to be construed as advantageous over other implementations.

The present disclosure describes cutting tools, reactors and processes for machining of materials.

In one embodiment, a boron-doped graded diamond thin film 1000 for use in surface coating a cemented carbide (WC—Co) cutting tool material is provided herein, as illustrated in FIG. 1A-1D. The diamond film includes a top coating layer 1001 comprising nanocrystalline diamond (NCD), a transition layer 1002 and a bottom coating layer 1003 comprising boron-doped microcrystalline diamond (BMCD).

In one embodiment, the concentration of boron in the bottom layer 1003 is between 0.2 to 0.25%. In another embodiment, the top layer 1001 is substantially free of boron. In yet another embodiment, the transition layer 1002 is made of a decreasing gradient of boron from the bottom layer 1003 to the top layer 1001. In some embodiments, the boron concentration in the surface of transition layer 1002 in contact with the bottom layer 1003 is between 0.2 to 0.25%. In one embodiment, the boron concentration in the surface of transition layer 1002 in contact with top layer 1001 is substantially free of boron.

In one embodiment, the thickness of the thin film 1000 (FIG. 1A) is between 4 to 10 microns. In another embodiment, the thickness of the bottom layer 1003, transition layer 1002, and top layer 1001 are 1 to 6 microns, 0.1 to 5 microns, and 0.01 to 3 microns, respectively. In another embodiment, the thickness of the bottom layer 1003, transition layer 1002, and top layer 1001 are 1-5 microns, 0.1-1 microns and 0.01-0.1 microns, respectively. In one embodiment, the bottom layer 1003 constitutes 10 to 25% of the total thickness of the thin film. In another embodiment, the top layer 1001 constitutes 10 to 30% of the total thickness of the thin film. In yet another embodiment, the transition layer 1002 constitutes 40 to 70% of the total thickness of the thin film.

In one embodiment, the lattice structures for the top layer 1001, transition layer 1002 and bottom layer 1003 are as illustrated in FIGS. 1B, 1C, and 1D, respectively. The top layer 1001 includes a NCD lattice structure made of carbon atoms 1010 in a substantially $sp^3$ diamond crystal structure as illustrated in FIG. 1B. The bottom layer 1003 includes a BMCD lattice structure made of both boron 1020 and carbon atoms 1010 arranged in an $sp^3$ diamond structure as shown in FIG. 1D. The transition layer 1002 as illustrated in FIG. 1C includes both boron 1020 and carbon atoms 1010 arranged in an $sp^3$ diamond structure, with concentration of boron atoms decreasing from the bottom to top layer.

Figure 2:
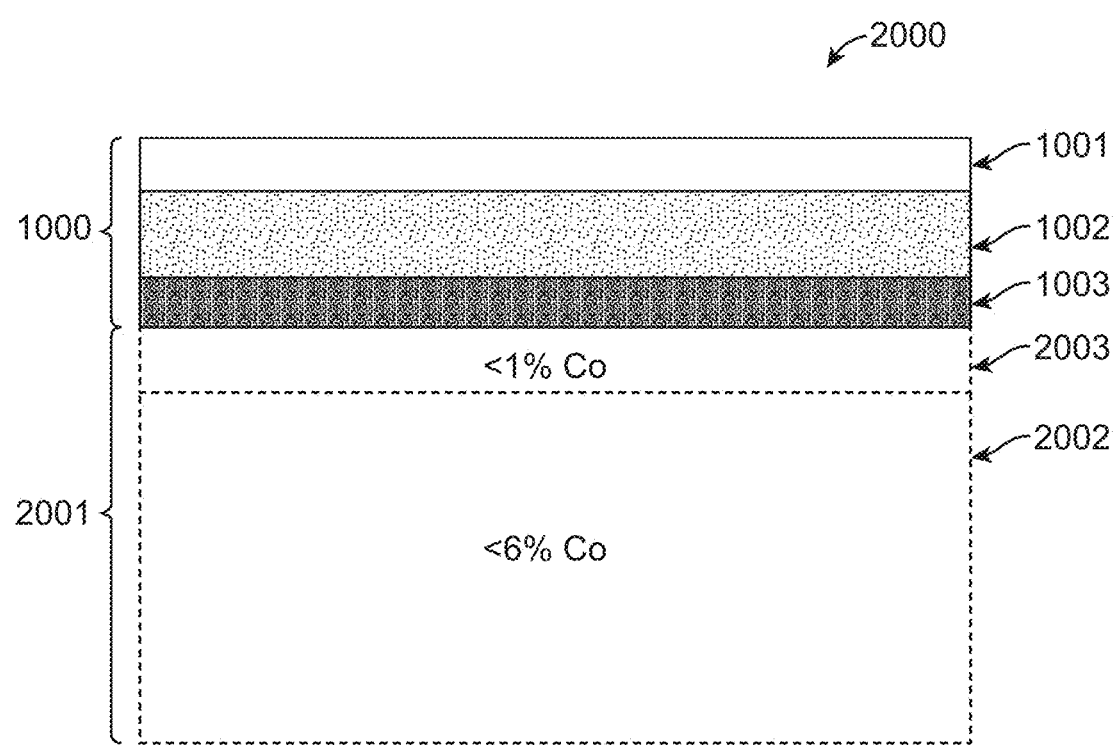
FIG. 2 shows the structure of a boron-doped graded diamond thin film coated on a WC—Co surface layer.

In one embodiment, an enhanced cutting tool 2000 is included, as illustrated in FIG. 2. In some embodiments, the cutting tool is made of the diamond thin film 1000 coated on a cemented carbide (WC—Co) substrate 2001 including a matrix 2002 and a cobalt-depleted surface layer 2003. In some embodiments, the bottom layer 1003 of the diamond thin film 1000 is formed over the cobalt-depleted surface layer 2003. In one embodiment, the matrix 2002 includes 1 to 6% cobalt. In another embodiment, the cobalt-depleted surface layer 2003 includes 0.1 to 1% cobalt.

In some embodiments, the top NCD layer 1001 of the cutting tool 2000 has a low friction coefficient. In some embodiments, the bottom BMCD layer 1003 of the cutting tool 2000 in the coating-substrate interface yields better interfacial adhesion through cobalt and boron reactivity. In some embodiments, the adhesion strength, cutting performance, tool life of the cutting tool 2000 is improved over other known MCD or NCD coating based tools. In some embodiments, the BMCD layer 1003, the transition layer 1002 and the NCD layer 1001 of the cutting tool 2000 are configured to have mechanical and interfacial properties so as to minimize the lattice mismatch and reduce sharp stress concentration across the coating.

In some embodiments, the cutting tool 2000 is intended for use in machining hard metals. In one embodiment, the cutting tool 2000 is for use in machining of carbon fiber reinforced plastic (CFRP), ceramic or metal matrix composites.

In one embodiment, the grain size of the top NCD layer 1001 of the cutting tool 2000 is between 100 to 600 nm. In one embodiment, the grain size of the top NCD layer 1001 of the cutting tool 2000 is between 100 to 1000 nm. In one embodiment, the grain size of the bottom BMCD layer 1003 of the cutting tool 2000 is between 500 to 1500 nm. In one embodiment, the grain size of the bottom BMCD layer 1003 of the cutting tool 2000 is between 500 to 1500 nm. In one embodiment, the grain size of the transition layer 1002 of the cutting tool 2000 is between 100 nm to 1500 nm. In another embodiment, the surface roughness of the cutting tool 2000 is 100 nm or lower.

Figure 3:
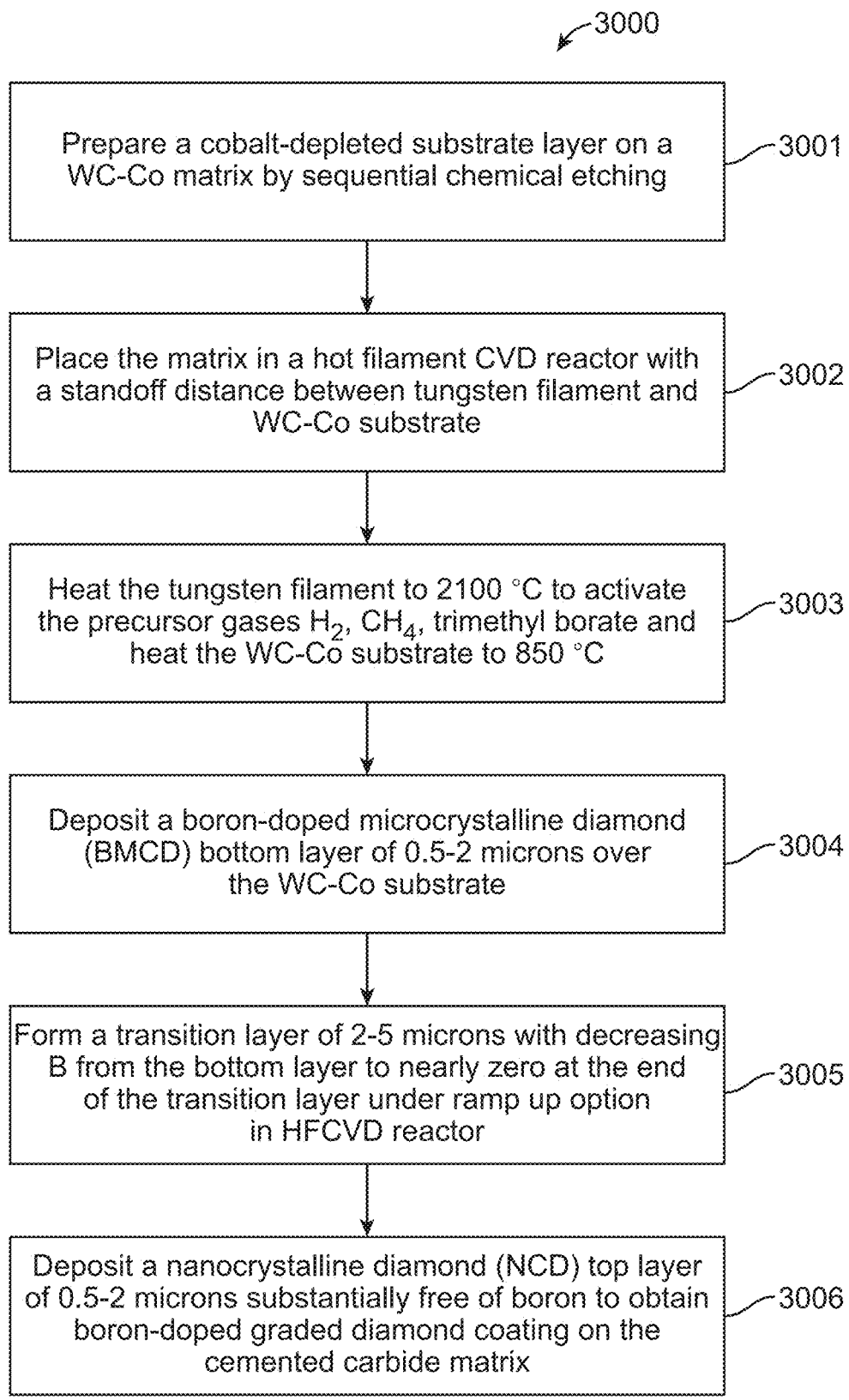
FIG. 3 shows a process for obtaining a boron-doped graded diamond thin film coating on WC—Co surface layer.

In certain embodiments, a process 3000 for obtaining the enhanced cutting tool 2000 in terms of steps 3001 to 3006 is provided, as illustrated in FIG. 3. In one embodiment, a cobalt depleted surface layer 2003 (FIG. 2) is prepared on a cemented carbide (WC—Co) matrix 2002 by sequential chemical etching of the carbide and the cobalt in step 3001. In one embodiment, the sequential etching in step 3001 of the process 3000 comprises sequentially etching the carbide substrate 2001 using Murakami reagent, followed by etching of the cobalt using Caros acid. In various embodiments the etching using Murakami reagent is carried out for a predetermined time between 5-20 min. In some embodiments, the carbide etching creates minute pores on the tungsten carbide particles and facilitates mechanical interlocking with the diamond coating 1000 deposited thereon. In one embodiment, etching using Caros acid solution is carried out for 5-20 seconds.

In certain embodiments, the diamond thin film coatings 1001-1003 are grown on the carbide substrate through hot filament chemical vapour deposition method (CVD) in a reactor in step 3002. In some embodiments, a standoff distance of at least 15 mm is maintained between a refractory tungsten filament fitted in the reactor and the cobalt-depleted surface 2003 of the carbide substrate 2001.

In some embodiments, one or more of precursor gases including hydrogen, methane, and trimethyl borate are activated with the refractory tungsten filaments heated to a temperature of 2000° C. or greater to grow the diamond on carbide substrate 2001 in step 3003. In some embodiments, the precursor gas concentration flowing through the reactor is between 2% to 4%. In some embodiments, the cemented carbide 2001 is heated to a temperature of 850° C. or greater prior to coating.

In one embodiment, the bottom BMCD layer 1003 is deposited over the cobalt depleted surface layer 2003 in step 3004. In some embodiments, the precursor gas flowing through the reactor is between 2% to 4%. In one embodiment, the precursor gas includes hydrogen and methane. In certain embodiments, trimethyl borate gas is included in the reactor for boron-doping of the bottom layer 1003. In one embodiment, a reactor pressure of 4000-5000 Pa is maintained to obtain the bottom layer 1003. In one embodiment, the coating time is between 1 to 3 h.

In certain embodiments, the transition coating layer 1002 is deposited over the bottom layer 1003 formed on the carbide substrate 2001 by changing the reaction conditions through a ramp up option in the hot filament CVD reactor in step 3005. In some embodiments, the precursor gas flowing through the reactor is between 0 to 4%. In one embodiment, the reactor supplies the precursor gases in a decreasing concentration gradient. In another embodiment, the precursor gas includes hydrogen and methane. In one embodiment, the transition coating layer 1002 is obtained by decreasing the concentration of boron by decreasing the flow rate of trimethyl borate in the reactor. In one embodiment, the boron concentration in the surface of transition layer 1002 in contact with the bottom layer 1003 is between 0.2 to 0.25%. In one embodiment, the boron concentration in the surface of transition layer 1002 in contact with top layer 1001 is substantially free of boron. In one embodiment, a decreasing pressure gradient of 4800-2000 Pa is applied in the reactor to obtain the transition layer 1002. In one embodiment, the coating time is between 1 to 3 h.

In some embodiments, the top coating layer 1001 is deposited over the transition layer 1002 deposited over the bottom layer 1003 formed on the carbide substrate 2001 in step 3006 to obtain the cutting tool 2000. In some embodiments, the precursor gas flowing through the reactor is 1% to 2%. In one embodiment, the precursor gases include hydrogen and methane. In certain embodiments, the precursor gases are substantially free of trimethyl borate. In one embodiment, a reactor pressure of 1800-2200 Pa is maintained to obtain the top layer 1001. In one embodiment, the coating time is between 1 to 3 h.

In various embodiments of the coatings as illustrated in FIG. 1A to 1D and FIG. 2 and the process illustrated in FIG. 3 exhibit superior adherence to the WC—Co substrate, as evidenced by indentation test. In some embodiments the coating adherence when testing using an indenter load applied on the film surface of 150 kg-f with indenter radius of 200 μm and dwell time of 10 seconds exhibited crack radius less than 400 μm around the indentation. In some embodiments the coating exhibits adherence under the same conditions with crack radius of 350 μm or less. In various embodiments the superior properties exhibited by the graded diamond coating illustrated in embodiments of the invention are due to the substantially $sp^3$ diamond structure in the interfacial layers and and the relative absence of $sp^2$ phase (non-diamond phase) in the grain boundaries.

The embodiments of the process illustrated in FIG. 3 with associated description demonstrate superior properties in the coatings due to a high degree of crystallinity and phase purity. The experimental results as presented further in the examples also illustrate the excellent interfacial bond strength between the bottom layer 1003 of the coating and the substrate due to suppression of cobalt diffusion from the cemented carbide to the bottom diamond layer.

While the invention has been particularly shown and described with respect to the illustrated embodiments thereof and the examples to follow, it will be understood by those skilled in the art that the foregoing and other changes in form and details may be made therein without departing from the spirit and scope of the invention as set forth in the claims to follow. Furthermore, the below examples are merely illustrative. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context.

Examples

Example 1—Treatment of Cemented Carbide Substrate

Figure 4B:
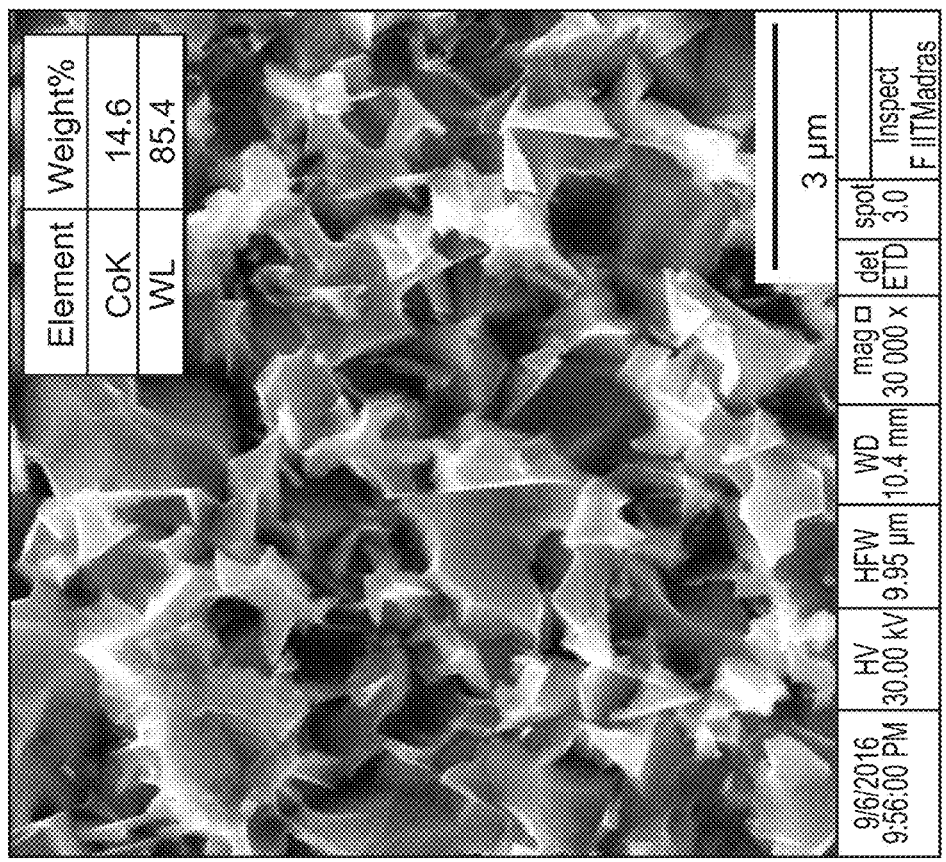
FIG. 4 shows the surface structure of WC—Co surface layer.
Figure 4A:
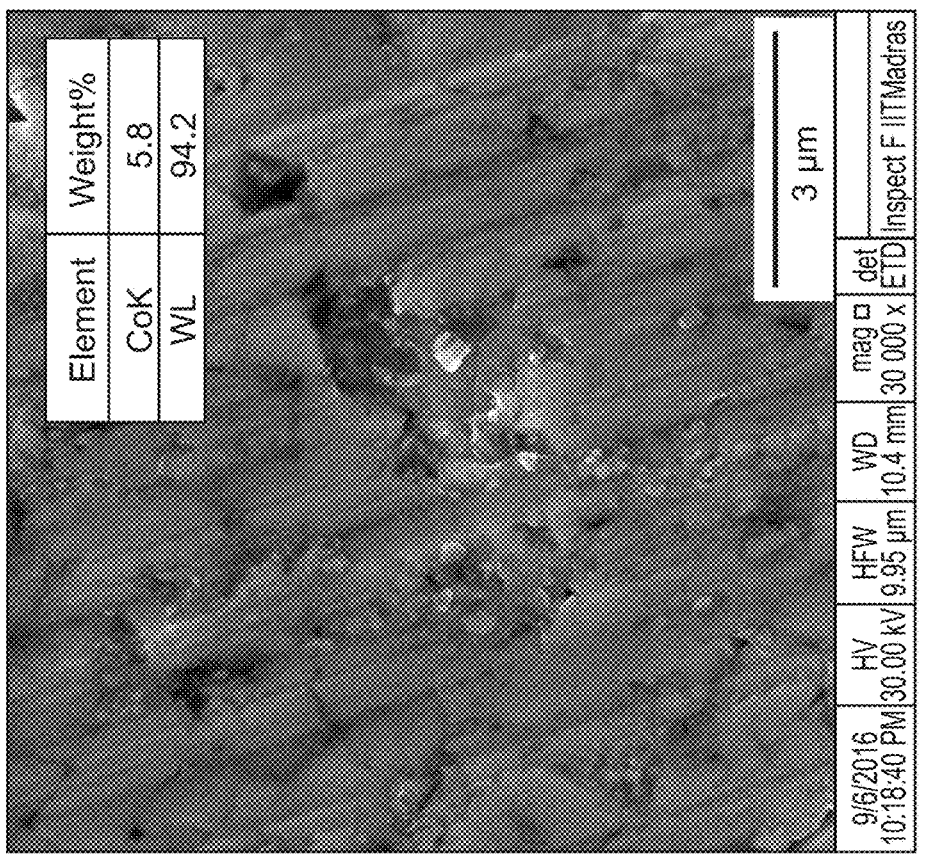
Figure 4C:
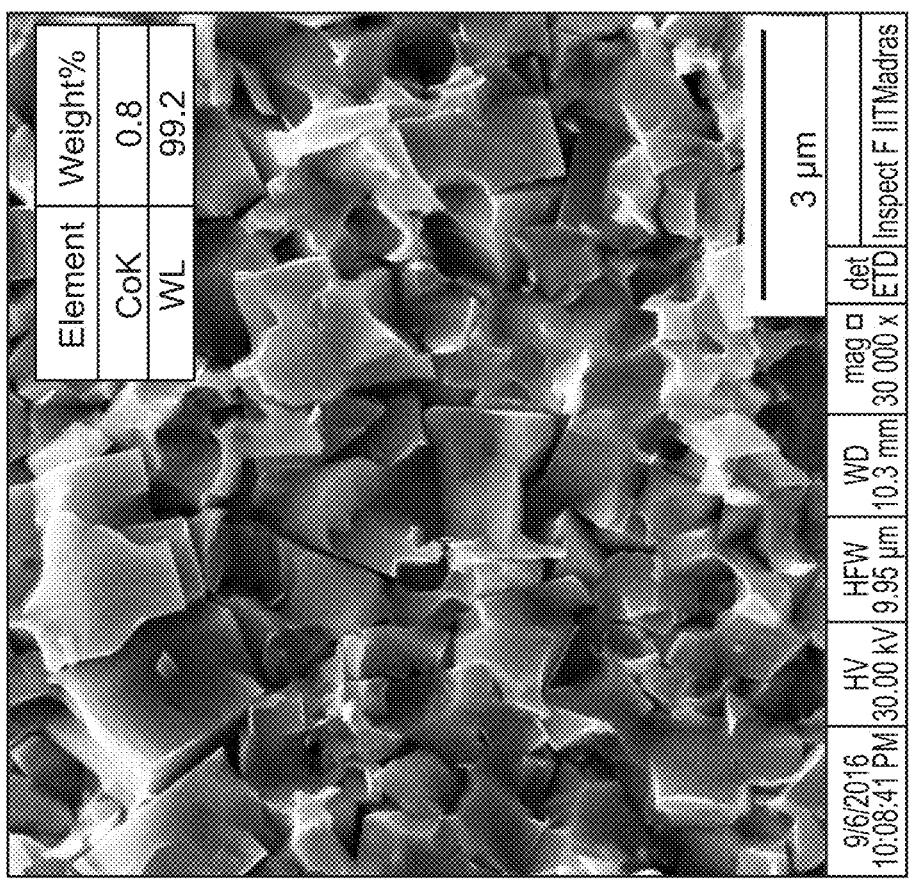

A commercially available cemented tungsten carbide (WC—Co, THM-SPUN120308) was selected as a substrate material for diamond coating because of its low thermal mismatch and good fracture toughness, as shown in FIG. 4A. Prior to diamond deposition, tungsten carbide etching was carried out by treating the substrate surface with Murakami reagent [10 g KOH+10 g $K_3[Fe(CN)_6]$+100 ml of distilled water] for 10 min. Followed by this, cobalt etching was carried out on the Murakami treated carbide surface using Caros acid solution [3 ml of $H_2SO_4$ (96%)+88 ml of $H_2O_2$ (30%)] for 10 seconds. The carbide etching creates minute pores on the tungsten carbide particle and facilitates mechanical interlocking of diamond. But minute pore formation enhances the surface cobalt value to 14.6% with a reduction in elemental WC value to 85.4% as shown in FIG. 4B. However, metallic cobalt concentration on the surface was detrimental to the diamond coating. Hence, to reduce the surface cobalt, successive cobalt etching was carried out on the Murakami treated sample and reduces the surface cobalt concentration down to 0.8% and corresponding WC value found to be 99.2% as shown in FIG. 4C.

Example 2—Diamond Seeding

After cobalt etching, diamond seeding (4-6 nm particle size) from dimethyl sulfoxyl solution was done for 1 hour by ultrasonically agitating the substrate surface since it helps in increasing the nucleation density during diamond growth.

Example 3—HFCVD Growth

Cemented carbide tools are widely used due to its high load bearing capacity and high toughness and better nucleation with diamond. The metallic cobalt present in the tungsten carbide, which provides enhanced toughness, can also be detrimental to the diamond coating due to the occurrence of graphitisation at the diamond-carbide interface. Therefore, successive chemical etching such as Murakami reagent for carbide etching and Caro's acid treatment for surface cobalt etching was performed on the carbide substrate to have better mechanical interlocking with diamond.

The diamond thin films were grown on carbide substrate through hot filament chemical vapour deposition method. Precursor gases such as methane and hydrogen were used to facilitate the growth of diamond on carbide substrate. The methane, primarily a source for carbon and hydrogen for stabilising the $sp^3$ diamond lattice was precisely controlled by mass flow controller. A refractory tungsten filaments was used as a source for activating the above precursor gases. An infrared pyrometer measured the temperature of the hot tungsten filament. The carbide substrate was heated to 850° C. through the principle of radiation heating from the tungsten filament. The k-type thermocouple coupled with this reactor measured the temperature of the carbide substrate.

The boron atoms per cubic centimetre in diamond was calculated by using an equation $[B]/cm^{-3}=8.44\times10^{30}$ exp $(-0.048\omega)$ where w represents boron dimer peak in $cm^{-1}$. The calculated [B] value found to be $3.67\times10^{20}/cm^3$.

The coating conditions including pressure, substrate temperature, methane hydrogen concentration, boron concentration are shown in Table.1.

TABLE 1

Deposition conditions of CVD Diamond coatings

| Coating variants | Substrate Temperature (° C.) | Filament Temperature (° C.) | Boron Concentration (%) | $CH_4/H_2$ Concentration (%) | Process Pressure (Pascal) | Coating Time (hrs) |
|---|---|---|---|---|---|---|
| MCD | 850 | 2100 ± 50 | 0 | 2 | 4800 | 6 |
| NCD | 850 | 2100 ± 50 | 0 | 4 | 2000 | 6 |
| BMCD | 850 | 2100 ± 50 | 0.22 | 2 | 4800 | 6 |
| BMCD | 850 | 2100 ± 50 | 0.22 | 4 | 4800 | 2 |
| Transition | 850 | 2100 ± 50 | * | * | * | 2 |
| NCD | 850 | 2100 ± 50 | 0 | 2 | 2000 | 2 |

* Indicates linear transition of process parameters from BMCD to NCD

Example 4—Structural Characterization

Figure 5B:
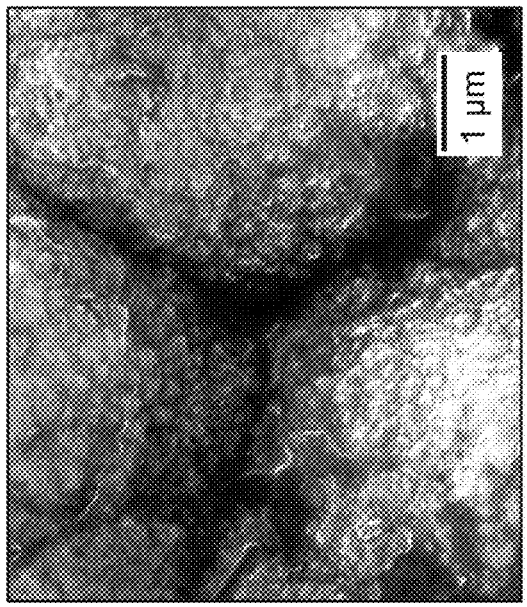
FIG. 5 shows the morphology of as deposited diamond coatings.
Figure 5D:
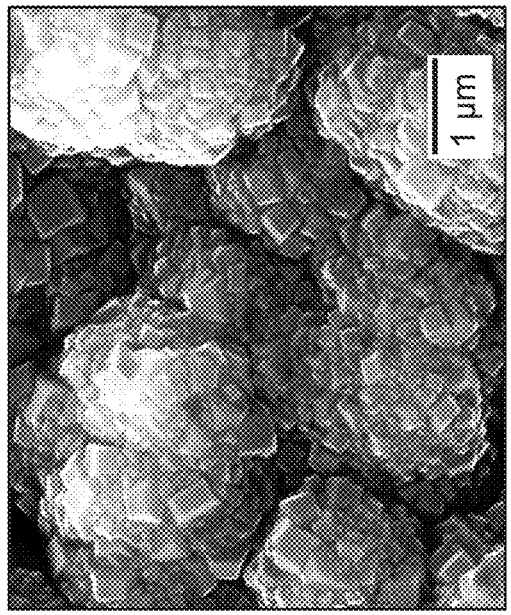
Figure 5A:
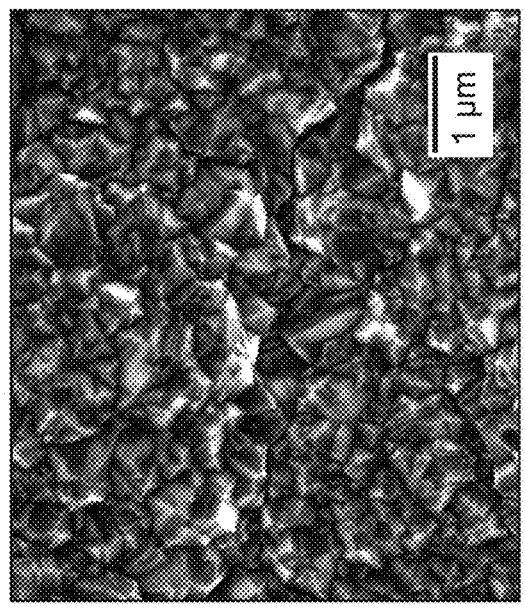
Figure 5C:
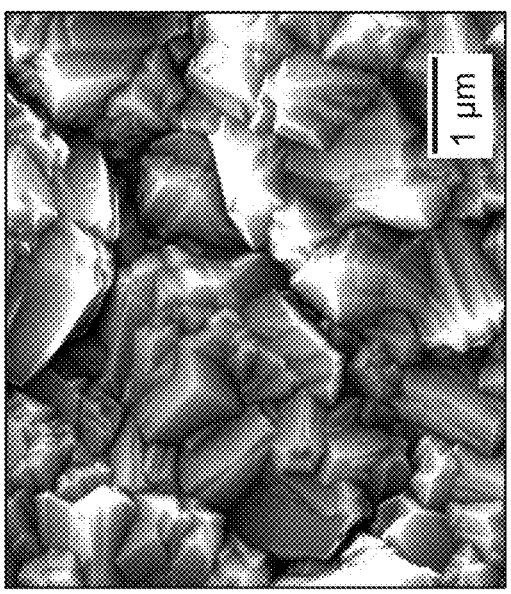

The morphology of as deposited diamond coatings were studied using high resolution scanning electron microscope (HRSEM) and its corresponding cross section was shown in cross sectional Raman mapping. During MCD condition, the individual diamond nuclei were intersected with adjacent nuclei and grew in a columnar manner yielding bigger grain size. FIG. 5A represents well faceted microcrystalline diamond with grain size in the range from 0.75 to 1 μm. But in NCD condition, the more number of secondary nucleation occurred due to higher methane concentration thus finer grain size was obtained. FIG. 5B shows typical cauliflower morphology of nano-crystalline diamond with grain size in the range from 40-80 nm. Due to the boron doping in MCD condition, more impurities were incorporated in the grain boundaries leading to slight increase in diamond growth rate. Therefore BMCD morphology ended with spherical clusters with increase in grain size from 1 to 1.5 μm, as shown in FIG. 5C. In the boron doped graded layer architecture, the increase in nucleation density along with lower NCD thickness at the top of the coating contributes faceted nano-crystallites termed as faceted nano-crystalline and the corresponding grain size are in the range from 400-500 nm as shown in FIG. 5D.

The surface roughness was calculated using Atomic force microscopy. The surface roughness value of MCD, Ra, was found to be 88 nm. The Ra value of NCD obtained was 55 nm. On the other hand for BMCD and the boron-doped graded diamond thin film layer coating, the corresponding Ra values observed were 132 nm and 63 nm, respectively.

Figure 6A:
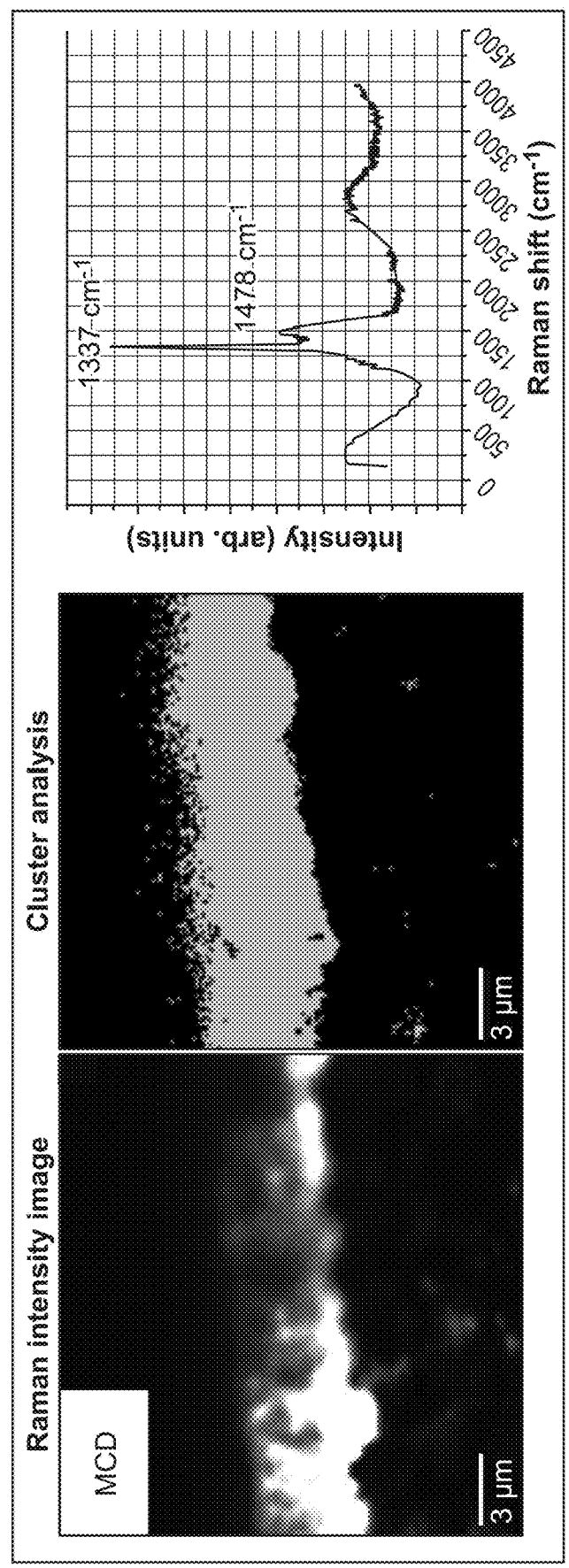
FIG. 6 shows the Raman intensity image, cluster analysis and cross sectional Raman spectrum for the MCD, NCD and BMCD coatings.

Raman spectroscopy is a powerful and non-destructive technique to analyze the quality of diamond coatings. To understand the carbon, boron distribution and its uniformity in the interfacial region, the Raman mapping was done on the diamond coated cross sectional samples using Nd-YAG laser with 532 nm excitation wavelength. FIGS. 6A, B and C (left) shows the average integrated intensity variation of Raman spectrum for MCD, NCD and BMCD with coating thickness of approximately 4-5 μm thickness in all diamond coatings. FIGS. 6A, B and C (middle) show the cluster analysis of cross sectional samples for MCD, NCD and BMCD coatings. FIGS. 6A, B and C (right) represent the cross sectional Raman spectrum of MCD, NCD and BMCD. Similarly, the average integrated intensity variation of Raman spectrum for the boron-doped graded diamond thin film coating was obtained, as illustrated in FIG. 7A. The corresponding cluster analysis of cross-section is shown in FIG. 7B. The cross sectional Raman spectrum is shown in FIG. 7C.

Figure 6B:
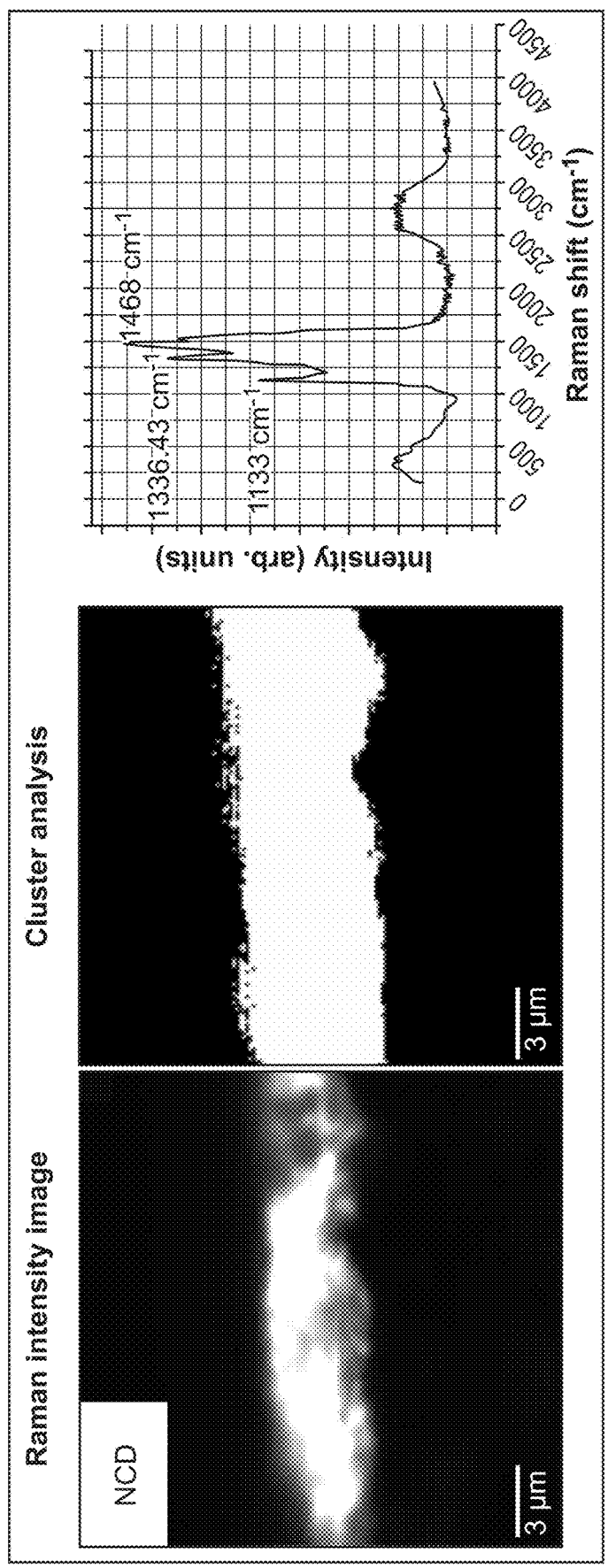

Raman spectrum of MCD showed narrow peak at 1337 $cm^{-1}$ confirming $sp^3$ diamond along with low intensity $sp^2$ diamond at 1478 $cm^{-1}$ as shown in FIG. 6A (middle). The presence of high $sp^3$ (C—C) content relates to high hardness in diamond films leads to good wear resistance characteristics whereas presence of $sp^2$ (C—H) contributes for lower coefficient of friction and hence it act as a self-lubricant which attracted towards tribology and machining applications. The Raman spectrum of NCD showed broad peak at 1336.43 $cm^{-1}$ along with high intensity peak at 1468 cm which represents a $sp^2$ phase. The peak at 1133 $cm^{-1}$ indicates trans polyacetylene chain present in the grain boundaries as shown in FIG. 6B (middle). The broader peak in NCD attributed to its smaller grain size with more number of grain boundaries.

Figure 6C:
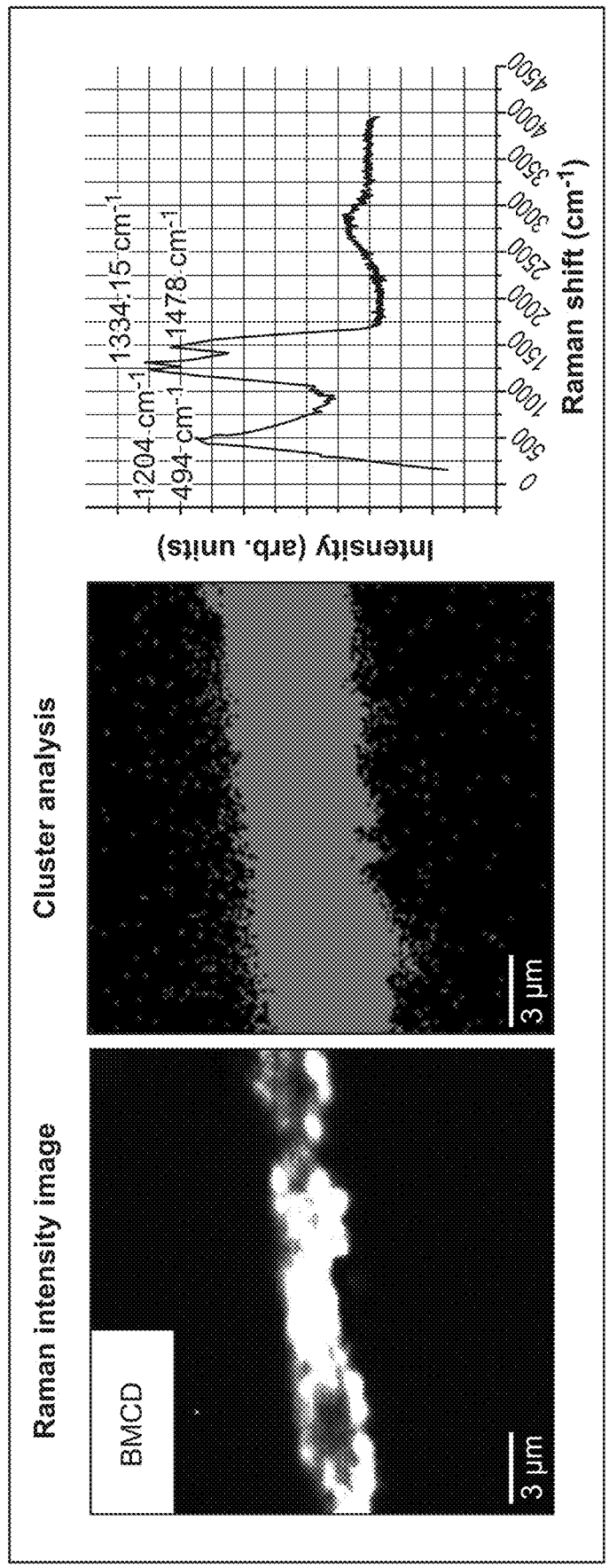

Raman spectrum of BMCD showed a peak at 1334.15 $cm^{-1}$ confirming $sp^3$ phase and $sp^2$ phase at 1478 $cm^{-1}$. Apart from these two primary peaks, there were other peaks at 494 $cm^{-1}$ and 1204 $cm^{-1}$ confirming the presence of boron doped diamond as shown in FIG. 6C (middle). The Raman spectrum of boron-doped graded diamond thin film coating were distinguished into three layers with BMCD in bottom followed by transition layer and top layer ended with NCD. Each layer clearly shows the respective Raman spectrum. The BMCD in the graded layer indicated peak at 493 $cm^{-1}$, 1204 $cm^{-1}$ along with sp3 and sp2 phase. The high intense boron peak from BMCD was broadened in the transition layer and diminished in the top layer of NCD where the NCD peak at 1153 cm-1 along with two other sp3 and sp2 phases as shown in FIG. 7C.

Example 5—Adhesion of Boron-Doped Graded Diamond Thin Film Coating

Figure 8A:
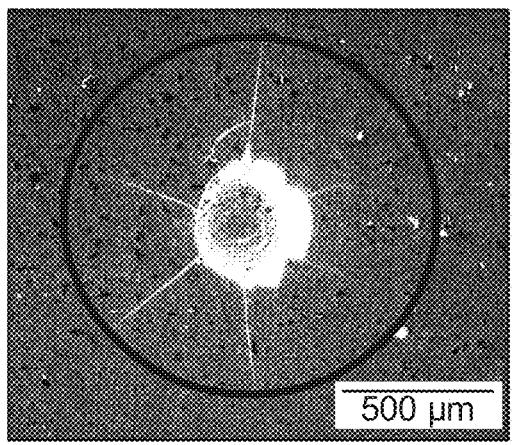
FIG. 8 shows the indented area of the coating films through Rockwell indenter as seen in scanning electron microscopy images.
Figure 8B:
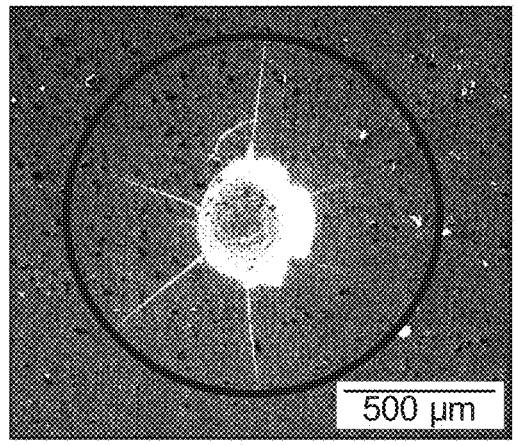
Figure 8C:
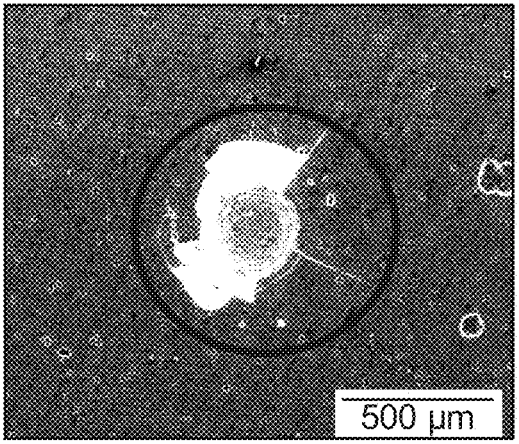
Figure 8D:
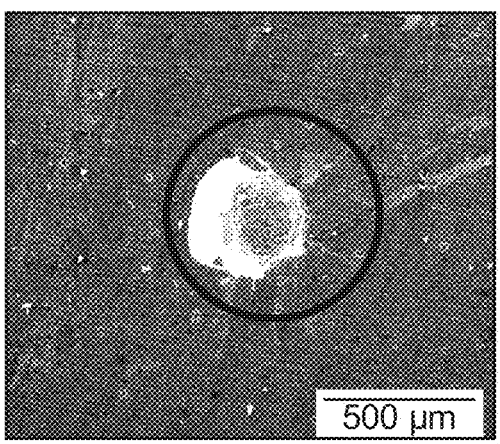

Rockwell indentation test was conducted on the diamond thin films and crack propagation was measured through scanning electron microscopy. FIGS. 8A, B, C and D showed the indented area on MCD, NCD, BMCD and the boron-doped graded diamond coating films through Rockwell indenter and their respective deformations were analysed by scanning electron microscopy. The indenter load applied on the films surface was 150 kg-f with dwell time of 10 seconds. The conical Rockwell indenter radius of 200 μm was used for this present study. From the indentation results, the radius of the crack propagation for MCD, NCD, BMCD and graded layer were determined and found to be 623 μm, 651 μm, 414 μm, and 350 μm respectively.

On the other hand, the radius of crack propagation for BMCD films and boron doped graded layer diamond films was found to be 414 μm and 300 μm respectively. The reason attributed to the lower values in comparison with conventional diamond films could be due to the enhanced interfacial adhesion by suppressing catalytic effect of metallic cobalt.

Diamond coatings with distinct morphology were fabricated through HFCVD reactor. The surface morphology of the diamond coating showed the shape and grain size of the respective coatings. The cross section of the coated samples was analyzed by Raman mapping and it clearly showed the distribution of boron in the interface with respective Raman spectrum. Rockwell indentation was performed on the diamond films to study the adhesion strength of the CVD grown diamond films. MCD and NCD underwent severe crack propagation due to the poor interfacial adhesion between substrate and coating. However for boron doped diamond the radius of crack propagation was minimal compared with MCD & NCD coatings. Besides, there was no appreciable crack propagation in boron doped graded layer diamond coating. These results confirmed that, by doping boron in the diamond lattice, cobalt diffusivity in the diamond is hindered through cobalt boron reactivity and hence enhanced adhesion was achieved in the interfacial region of the coating.

We claim:
1. A boron-doped graded diamond thin film for forming a highly adhesive surface coating on a cemented carbide (WC—Co) cutting tool material, comprising:
   i. a bottom coating layer formed on a surface layer of the cemented carbide material, comprising a boron-doped microcrystalline diamond (BMCD), wherein the concentration of boron in the BMCD layer is between 0.2-0.25%, and wherein the concentration of cobalt in the surface layer is between 0.1-1%;
   ii. a top coating layer, comprising nanocrystalline diamond (NCD) substantially free of boron; and
   iii. a transition coating layer formed between the top and bottom layers, comprising a decreasing concentration gradient of boron from the bottom layer to top layer, wherein the concentration of boron in the surface of transition layer in contact with the bottom layer is 0.2-0.25%, and wherein the concentration of boron in the surface of transition layer in contact with top layer is substantially free of boron.

2. The film of claim 1, wherein the total thickness is 4-10 microns.

3. The film of claim 1, wherein the thickness of the bottom layer is 1-6 microns.

4. An enhanced cutting tool, comprising:
   i. A cemented carbide (WC—Co) matrix with a cobalt-depleted surface layer, wherein the matrix comprises 1-6% cobalt and wherein the surface layer comprises 0.1-1% cobalt;
   ii. a boron-doped graded diamond thin film coated on the cemented carbide matrix, comprising:
      a) a bottom coating layer formed on the surface layer of the cemented carbide material, comprising a boron-doped microcrystalline diamond (BMCD), wherein the concentration of boron in the bottom layer is between 0.2-0.25%;
      b) a top coating layer, comprising a nanocrystalline diamond (NCD) substantially free of boron; and
      c) a transition coating layer formed between the top and bottom layers, comprising a decreasing concentration gradient of boron from 0.2-0.25% in the surface in contact with the bottom layer to the surface in contact with the top layer substantially free of boron.

5. The cutting tool of claim 4, wherein the grain size of the top layer is 100 nm-1000 nm.

6. The cutting tool of claim 4, wherein the grain size of the bottom layer is 500-1500 nm.

7. The cutting tool of claim 4, wherein the grain size of the transition layer is 100 nm-1500 nm.

8. The cutting tool of claim 4, wherein the surface roughness value of the cutting tool is 100 nm or lower.

* * * * *